(12) United States Patent
Galli et al.

(10) Patent No.: US 7,554,276 B2
(45) Date of Patent: Jun. 30, 2009

(54) PROTECTION CIRCUIT FOR PERMANENT MAGNET SYNCHRONOUS MOTOR IN FIELD WEAKENING OPERATION

(75) Inventors: Giovanni Galli, Manhattan Beach, CA (US); Massimo Grasso, Trivolzio (IT); Cesare Bocchiola, Settimo Milanese (IT)

(73) Assignee: International Rectifier Corporation, El Segundo, CA (US)

( * ) Notice: Subject to any disclaimer, the term of this patent is extended or adjusted under 35 U.S.C. 154(b) by 352 days.

(21) Appl. No.: 11/533,508

(22) Filed: Sep. 20, 2006

(65) Prior Publication Data

US 2007/0063661 A1    Mar. 22, 2007

Related U.S. Application Data

(60) Provisional application No. 60/719,241, filed on Sep. 21, 2005.

(51) Int. Cl.
*H02P 5/00* (2006.01)

(52) U.S. Cl. ............ 318/109; 318/105; 318/140; 318/588; 307/64; 307/66

(58) Field of Classification Search ............ 318/44–56, 318/109, 139, 379, 442; 307/44–66; 361/23–32
See application file for complete search history.

(56) References Cited

U.S. PATENT DOCUMENTS

| | | | | |
|---|---|---|---|---|
| 4,516,665 A | * | 5/1985 | Watanabe | .......... 187/296 |
| 5,495,372 A | | 2/1996 | Bahlmann et al. | |
| 5,780,980 A | * | 7/1998 | Naito | .......... 318/139 |
| 5,796,175 A | * | 8/1998 | Itoh et al. | .......... 307/10.1 |
| 5,864,474 A | * | 1/1999 | Jang | .......... 363/39 |
| 6,094,363 A | * | 7/2000 | Cheng | .......... 363/26 |
| 6,239,566 B1 | * | 5/2001 | Tareilus et al. | .......... 318/379 |
| 6,275,392 B1 | * | 8/2001 | Streicher et al. | .......... 363/35 |
| 6,930,460 B2 | * | 8/2005 | Ishikawa et al. | .......... 318/442 |
| 2001/0030557 A1 | * | 10/2001 | Niimi | .......... 327/108 |
| 2003/0146726 A1 | * | 8/2003 | Ishikawa et al. | .......... 318/442 |
| 2005/0105229 A1 | * | 5/2005 | Deng et al. | .......... 361/90 |
| 2006/0214512 A1 | * | 9/2006 | Iwata | .......... 307/44 |
| 2007/0075585 A1 | * | 4/2007 | Matsuda et al. | .......... 307/43 |
| 2007/0097569 A1 | * | 5/2007 | Huang | .......... 361/56 |
| 2007/0158948 A1 | * | 7/2007 | Oyobe et al. | .......... 290/4 R |
| 2008/0157600 A1 | * | 7/2008 | Marlenee et al. | .......... 307/66 |

FOREIGN PATENT DOCUMENTS

EP        0 935 336 A2    8/1999
WO    WO 2004/049551 A    6/2004

* cited by examiner

*Primary Examiner*—Paul Ip
(74) *Attorney, Agent, or Firm*—Farjami & Farjami LLP

(57) ABSTRACT

A safety circuit for providing protection against failures that impact safety of an inverter circuit driving a Permanent Magnet Synchronous Motor (PMSM) including high and low side switches connected in a bridge and driven by a gate driver circuit during operation of the PMSM in a field weakening mode, the gate driver circuit including stages for driving the high and low side switches, the safety circuit comprising a main power supply and a back-up power supply for supplying voltage to the gate driver circuit driving the switches of the bridge of the inverter circuit, wherein if the main power supply fails to deliver adequate power to the gate driver circuit, the back-up power supply provides power to the gate driver circuit to allow the gate driver circuit to turn ON the low side switches and turn OFF the high side switches.

14 Claims, 3 Drawing Sheets

PROTECTION CIRCUIT FOR PERMANENT MAGNET SYNCHRONOUS MOTOR IN FIELD WEAKENING OPERATION

CROSS-REFERENCE TO RELATED APPLICATION

This application is based on and claims the benefit of U.S. Provisional Application Ser. No. 60/719,241, filed on Sep. 21, 2005, entitled FULL PROTECTION CIRCUIT FOR PERMANENT MAGNET SYNCHRONOUS MOTOR IN FIELD WEAKENING OPERATION, to which a claim of priority is hereby made and the disclosure of which is incorporated by reference.

BACKGROUND OF THE INVENTION

The present invention relates to safety interlock and protection circuits used in a DC-AC inverter motor controller driving a Permanent Magnet Synchronous Motor (PMSM) and particularly to a safety circuit implemented in a gate driver integrated circuit (IC) designed to drive the PMSM.

A PMSM has become an important power source for energy efficient appliances including air conditioners, refrigerators, washers, etc. The PMSM has higher power density and higher torque-per-amp than an induction motor. Induction motors have been commonly used in the past in appliance applications, e.g., washing machine applications. PMSMs have been used in more modern washing machines and have become an important power source for energy efficient appliances such as washing machines but also including air conditioners and refrigerators.

PMSMs are often driven by a DC-AC inverter circuit fed from an AC supply. That is, the AC main supply is first rectified/converted to a DC voltage, which is maintained across a DC bus. The DC bus voltage is supplied to the inverter to be converted to AC for driving each of the phases of the PMSM. There are typically three phases of the PMSM. Unlike the induction motor, when the PMSM is used with AC inverter circuits, it requires additional protections to guarantee the safety of the inverter. This is so especially when the PMSM is driven in the field weakening range. Driving a PMSM in the field weakening range is often mandatory, particularly in the automatic washing machine application in washers/spin extractors with a high-speed drum operating in the spin mode.

A micro-controller and/or a digital signal processor is a typical component for controlling the inverter. These control the inverter power switches, which are typically IGBTs or FETs, to apply the desired drive voltages to the PMSM, typically pulse width modulated (PWM) signals. Gate driver ICs are used between the controller device and the power switches for providing variable frequency/voltage to the PMSM, thus controlling the torque and speed of the PMSM. The gate driver is a critical element of the circuit. When the switch gates are not driven ON, the power switches remain in an OFF state, while the PMSM's energy may re-circulate through freewheeling diodes anti-parallel to the power switches, thus re-charging a bulk capacitor. In low cost applications, no provisions are made to return this energy back to the power line. All the energy is absorbed by the bulk capacitor.

The magnetic field is always present in the PMSM, as it is produced by the permanent magnets. This is different from an induction motor, in which the magnetic field has to be generated by proper control. In the event of a controller failure, i.e., due to a power line failure, brown out or even unplugging of the power cord, or a loss of the gate driver auxiliary power supply, the PMSM can exhibit two potentially dangerous conditions when operated in the field weakening region. The first is when the PMSM spins at high speed when coasting while slowing down. This condition creates a safety hazard and may result in bodily injury. The second condition is that a PMSM may generate over-voltage on the DC bus when the controller disengages from energizing the PMSM as a result of controller failure.

When in field weakening operation, the speed of the PMSM reaches very high values. During that time the counter Electromotive Force (EMF), known as Back EMF, generated by the motor when it spins freely, can be much higher than that of the rated value of the bulk capacitor. In a case of loss of control, such Back EMF can easily lead to the destruction of an inverter circuit and capacitor in addition to presenting a fire hazard.

The motor generated voltage can be particularly high when the motor is operated under a field weakening control to achieve a very high spin operation. If a failure occurs at that time, the generated voltage is very high. The voltage is proportional to the product of motor speed and flux generated by the PMSM as the rotor moves with respect to the windings. In the field weakening mode, if the controller fails and is unable to control the motor, the weakened flux changes to the full amount of flux (due to loss of flux weakening) while the motor speed may be reaching more than three or four times its nominal operating speed depending on the spin mode speed, resulting in high Back EMF.

If no action is taken during such a controller failure during field weakening operation, the DC bus voltage may reach approximately three to four times the nominal DC bus voltage. This will result in damage to the power devices and high voltage ICs in the system. The DC bus capacitor can also be damaged. Once damage occurs in the power system, it may no longer be possible to provide a safety door lock/braking mechanism since any circuits on the IC board will likely be damaged as well or be rendered inoperative.

Accordingly, it is desirable to manage, at the gate driver IC level, the causes for such lack of control during field weakening operation that could lead to generation of this high back EMF at high speed operation and prevent it. Thus the present invention has as an object to prevent a loss or brown out of the power line mains source or a loss of the gate driver auxiliary power supply from leading to a loss of control of the PMSM during high speed operation and to allow for rapid reduction of the motor and drum speed without generating high Back EMF that could damage the system components.

SUMMARY OF THE INVENTION

According to the invention, a safety circuit is provided for protecting against failures that impact safety of an inverter circuit driving a permanent magnet synchronous motor (PMSM) including high and low side switches connected in a bridge and driven by a gate driver circuit during operation of the PMSM in a field weakening mode, the gate driver circuit including stages for driving the high and low side switches. The safety circuit includes a main and a back-up power supply for supplying voltage to the output stage driving the switches of the bridge of the inverter circuit. In one embodiment, the back-up power supply provides power to the gate driver circuit when the main power supply fails to allow the low side switches to be turned on and the high side switches to be turned off, the turning on of the low side switches effectively shorting the motor terminals, braking the motor and short circuiting the back EMF.

Other features and advantages of the present invention will become apparent from the following description of the invention that refers to the accompanying drawings.

BRIEF DESCRIPTION OF THE DRAWING(S)

DETAILED DESCRIPTION OF EMBODIMENTS OF THE INVENTION

Figure 1:
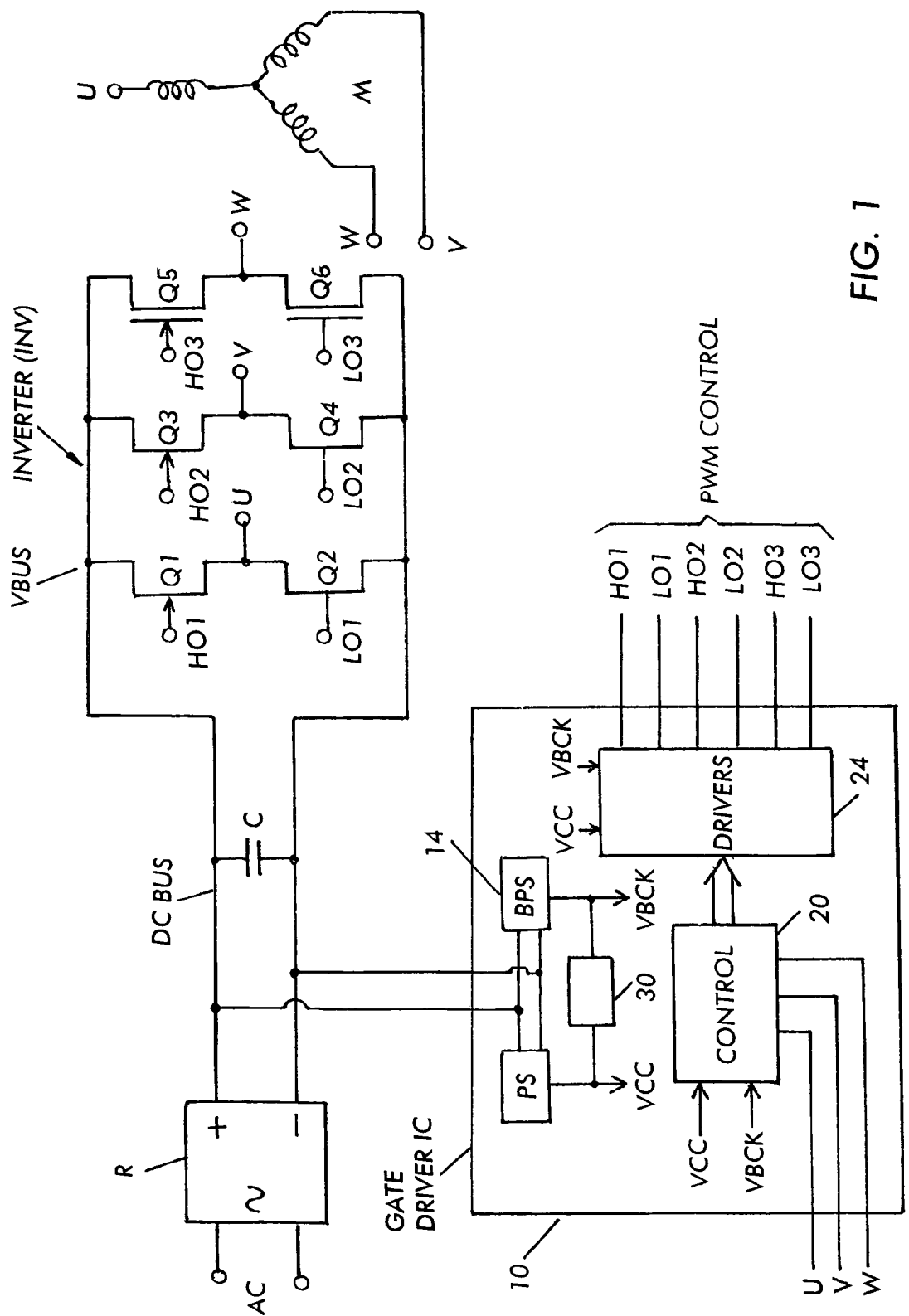
FIG. 1 shows a block diagram of a PMSM controller and inverter incorporating the protective circuit of the present invention.

FIG. 1 shows a block diagram of a PMSM controller. Alternating current (AC) from the main supply is fed to a rectifier stage R which can include, for example, a boost converter stage. The output of the rectifier R is a DC bus voltage. The DC bus voltage is smoothed by a bulk storage capacitor C. The DC bus voltage is provided to an inverter stage (INV) which converts the DC voltage to an AC voltage for driving the motor M phases, in this case, three phases U,V,W. The inverter, for a three phase motor as shown, includes three half bridges comprising series connected semiconductor switches $Q_1$, $Q_2$; $Q_3$, $Q_4$; and $Q_5$, $Q_6$; connected across the DC bus. The gates HO1, LO1; HO2, LO2 and HO3, LO3 of the high side and low side switches are controlled by a gate driver IC that provides gate signals to the switches to properly drive the motor at the desired speed, for example through pulse width modulation (PWM). The gate driver IC includes the control circuit CONTROL 20 required to drive the gate drivers 24 that directly drive the gates of the switches. The switches can be, for example, FETs, IGBTs or bipolar transistors.

Figure 2:
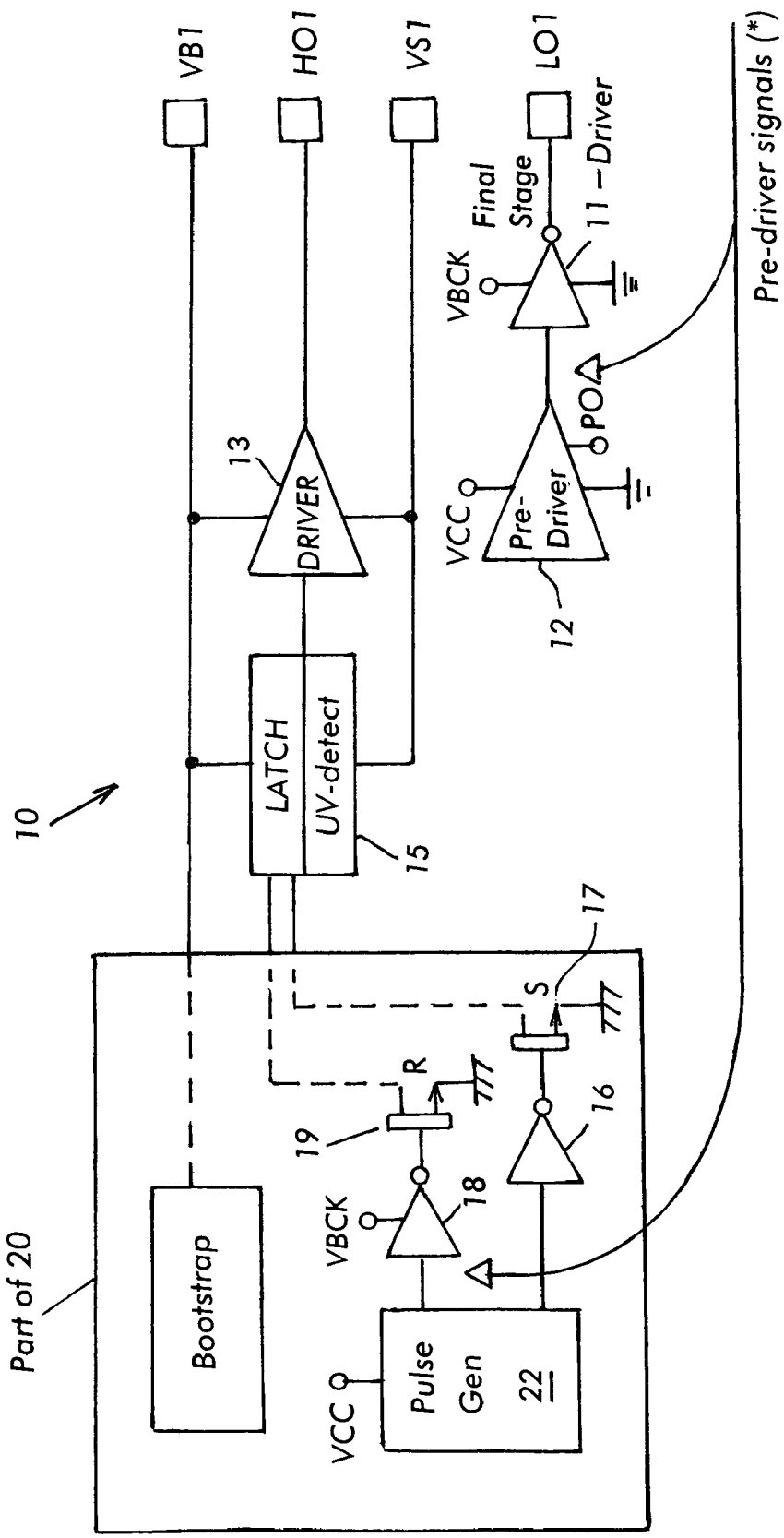
FIG. 2 shows details of a portion of the circuit of FIG. 1 showing a gate driver integrated circuit (IC) incorporating the safety circuit of the present invention.

Each set of outputs HO1, LO1; HO2, LO2, and HO3, LO3 is provided by identical control and driver circuits; FIG. 2 shows a portion of the control and driver circuitry for one set of outputs HO1 and LO1 driving the phase U switches. The circuitry for the other two phases is the same.

As shown in FIG. 1, the motor controller circuit includes a power supply (PS) that, during normal operation, provides DC power $V_{CC}$ to operate the controller (CON) from the DC bus. The invention provides a backup supply (BPS) 14 that provides a backup voltage $V_{BCK}$ to the gate driver circuitry and a modification of the gate driver circuitry so that during failure of the power supply PS, the voltage $V_{BCK}$ provides power to the gate driver circuitry to ensure that the motor is rapidly de-energized such that the motor speed is reduced to a safe speed and the back EMF is controlled to safe levels. This is accomplished by using the backup voltage $V_{BCK}$ as a power supply to allow the drivers to turn on the low side switch for each phase and causing a turn-off of each of the high side switches. As a result, the motor terminals are short circuited, which leads to braking of the motor and short circuiting of the back EMF.

A selection circuit 30 is provided to allow the back-up supply voltage to be provided to the control and driver circuits, and will be described later.

Turning now to FIG. 2, the present invention is directed to a safety circuit that can be implemented in the control/gate driver circuit 10 designed to drive a Permanent Magnet Synchronous Motor (PMSM). An embodiment of the safety circuit integrated in the control/gate driver circuit (IC) 10 is illustrated in FIG. 2. The circuit 10 may be contained in the gate driver IC 10 of FIG. 1. The safety circuit can be used in numerous applications including automatic clothes washers and provides protection against several types of failures. These failures may impact the safety of the inverter circuit driven by the gate driver 10 during operation of a PMSM in a field weakening mode of operation. Such failures may happen, for example, when the auxiliary power supply (PS) for the gate drivers, fails or during line brown-out conditions.

Figure 4:
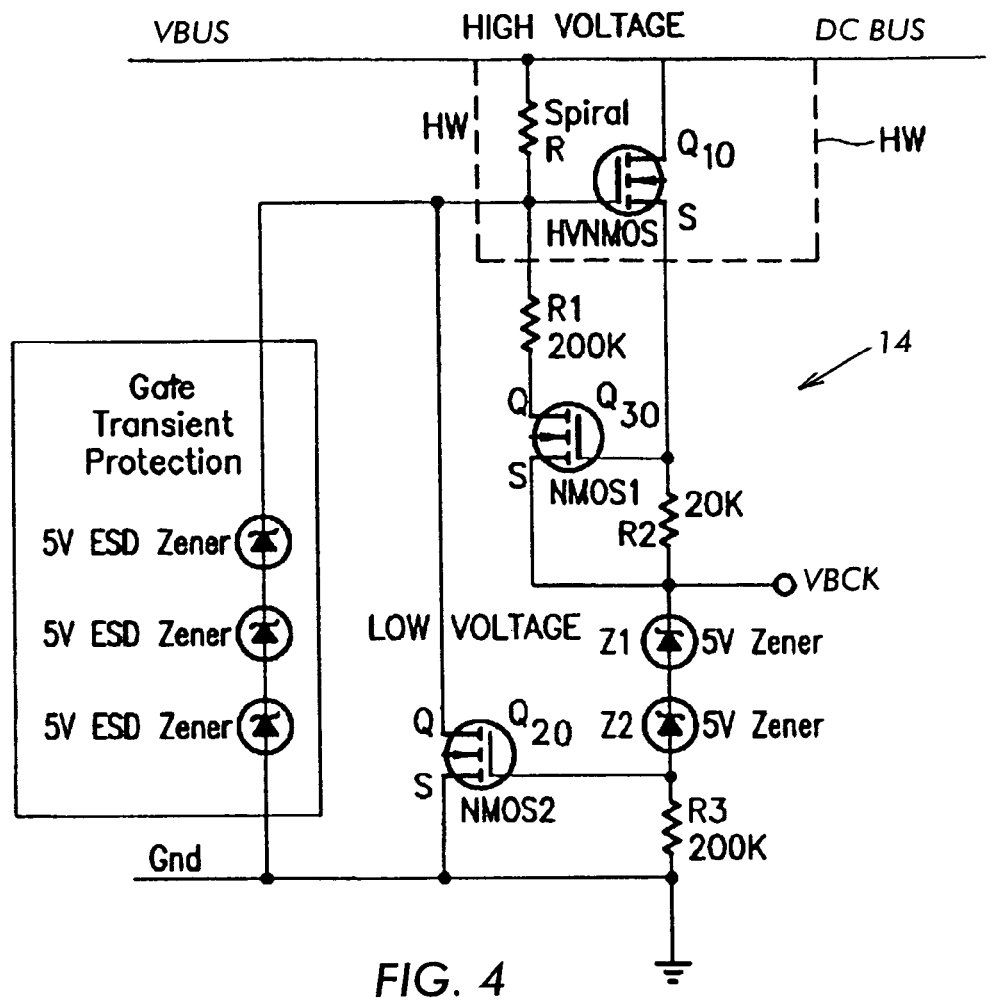
FIG. 4 shows an example of the backup power supply.

In the event of a failure of the $V_{CC}$ power supply PS, which may be caused by failure of the supply or a power motor failure or brownout, the protection circuit is fed by an internal back-up power supply BPS 14, fed from the DC bus capacitor C. An example of the back-up supply circuit is shown in FIG. 4 and will be described in detail later. The internal back-up power supply 14 supplies the back-up voltage $V_{BCK}$ to a driver output stage 11 that drives a low side switch, e.g., IGBT or FET, of a bridge of the inverter circuit and also to a pre-driver reset stage 18 coupled to the output of a pulse-generator 22 used for turning OFF the high side switch.

When $V_{CC}$ is operational, during normal operation, the pulse generator 22 provides a pre-driver signal at the appropriate time to reset stage 18, which turns OFF a switch 19 to reset a latch 15, which turns OFF the high side driver 13 to turn off the high side switch. Also during normal operation, when $V_{CC}$ is operational, pulse generator 22 issues a pulse signal at the appropriate time to a pre-driver stage 16 which controls switch 17 to set the latch 15 and turn ON the high side driver 13 to turn ON the high side switch. The pre-driver circuit 12 for the low side switch is driven by a similar pulse generator circuit, not shown.

If there is a loss of $V_{CC}$, i.e., $V_{CC}$ goes to ground because of PS failure or power main failure or brownout, the protective circuit of FIG. 2 is biased with the back-up voltage $V_{BCK}$ instead of $V_{CC}$. $V_{BCK}$ is provided to bias the reset stage 18 and the driver stage 11. When $V_{CC}$ fails, stage 18 turns ON a switch 19 when the input pre-driver signal to stage 18 fails due to $V_{CC}$ failure thereby to reset the latch 15 and thus turn OFF the high side driver 13 and thus the high side switch. At the same time, the driver 11 for the low side switch is provided with voltage $V_{BCK}$ which causes the output of driver 11 to go high when the input pre-driver signal fails when $V_{CC}$ fails, thus turning on the low side switch.

The identical circuitry is provided for driving the gates of the two other half bridges driving the V and W phases of the motor. This assures that the gate driver IC 10 is always able to drive ON the three low side power switches, thus short circuiting the terminals of the three phase PMSM, braking the motor and controlling the back EMF to safe levels.

During the $V_{CC}$ power supply failure, the internal back-up power supply 14 feeds the back-up voltage $V_{BCK}$, and the $V_{CC}$ voltage, if still present, continues to drive the pre-driver stage 12. As $V_{CC}$ moves to the ground voltage level during the failure, the input pre-driver signal to the output driver stage 11 is forced to the ground voltage level by the body diode of a P-channel switch in the last stage of the driver circuit 11 biased directly from $V_{CC}$. $V_{BCK}$ biases the driver stage 11 from the back-up power supply 14 to allow the driver stage 11 to then generate a driver signal to turn on the low side switch.

Similarly, with respect to the high side switch driver, the pre-drive signal input to pre-driver 18 goes low when $V_{CC}$ fails and this causes a reset condition at the gate of switch 19 to drive the high side switch OFF.

In summary, when $V_{CC}$ fails, the backup supply $V_{BCK}$ is fed from the DC bus (from the charge stored on bulk capacitor C)

to bias the gate driver stages to control the inverter switches to control the motor speed and the motor generated back EMF at safe levels.

Figure 3:
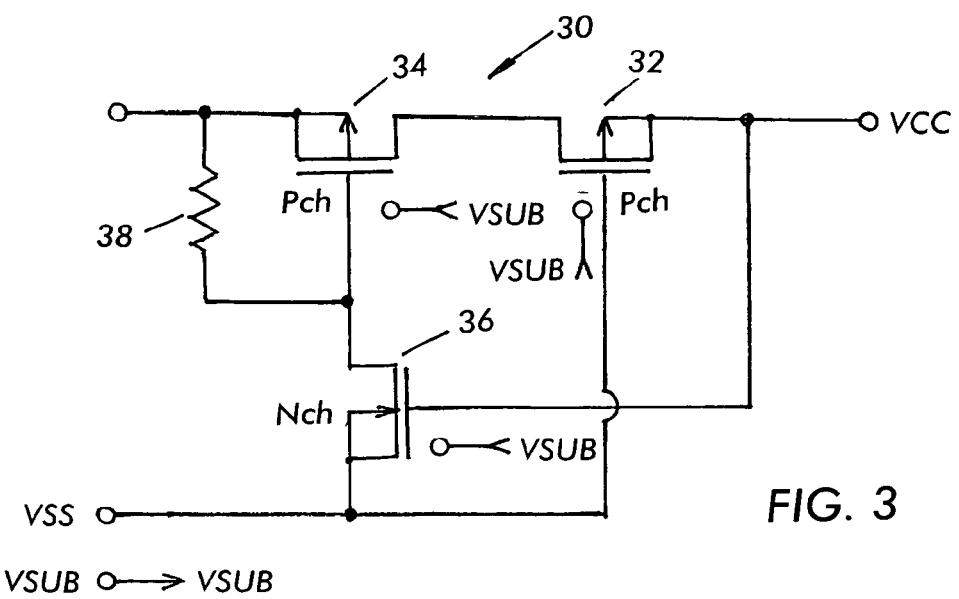
FIG. 3 is a diagram of a portion of the protective circuit that provides the back up power supply voltage in the event of the failure of the power supply.

Turning to FIG. 3, the protection circuit includes a selection circuit 30 that includes, e.g., three switches, two PMOS 32, 34 and one NMOS 36. The source of the first PMOS switch 32 is connected to the $V_{CC}$ source, the source of the second PMOS switch 34 is connected to the $V_{BCK}$ source, and the drains of the first and second PMOS switches 32, 34 are interconnected.

The gate of the second PMOS switch 34 is connected to the drain of the NMOS switch 36. The gate of the first PMOS switch 32 is connected to the source of the NMOS switch 36. The gate of the third NMOS switch 36 is connected to the $V_{CC}$ source.

Additionally, the circuit 30 includes a resistor 38 connected between the source and the gate of the second PMOS switch 34 to bias the gate of switch 34.

During normal operation, when $V_{CC}$ is present, the voltage $V_{BCK}$ from internal back-up supply 14 is removed from biasing the driver circuitry by $V_{CC}$ and all circuit components, including the pre-driver stage 12 and the output stage 11 receive $V_{CC}$. When $V_{CC}$ fails, circuit 30 provides $V_{BCK}$ to the components indicated in FIG. 2. To achieve this, the circuit 30 receives the voltage from the two power supplies, i.e., $V_{CC}$ and $V_{BCK}$, as inputs and provides only one supply output. If $V_{CC}$ is High, the one supply output is $V_{CC}$. If $V_{CC}$ is low, the one supply output is $V_{BCK}$.

When $V_{CC}$ is present, the third switch 36 (Nch) is turned ON; and the second switch 34 (Pch) is turned ON—the first switch 32 is ENABLED so that $V_{CC}$ and $V_{BCK}$ are at approximately the same potential.

When $V_{CC}$ fails, the third switch 36 is turned OFF and the second switch 34 is turned OFF—the first switch 32 is DISABLED, so $V_{BCK}$ is provided to the protection circuit as described above.

FIG. 4 shows an example of a back-up power supply circuit BPS 14 that can be used in the invention. It is also described in U.S. Patent Application Publication 2006/0033556A1, the entire disclosure of which is incorporated by reference herein.

FIG. 4 shows one example of a back-up power supply circuit 14 according to the present invention. The circuit comprises, illustratively, a circuit having high and low voltage portions. The high voltage section is contained within a high voltage well HW. The border of the high voltage well HW has a polysilicon resistor (spiral R) which may be a spiral shaped polyresistor which is used to shape the electric field. One terminal of the polyresistance is in the high voltage well and is connected to the high voltage DC bus $V_{BUS}$. The other terminal is in the low voltage side and is connected to the gate of a high voltage NMOS Q10. The value of the resistor spiral R is in the tens of megohms. It serves to turn on the high voltage resistor Q10.

The back-up supply circuit 14 provides a very low current power supply providing small currents, for example, tens of microamps at about 12 volts. The $V_{BCK}$ point is maintained at about 12 volts in the illustrated embodiment by the current flowing in the branch with the zener diode, shown illustratively as two zener diodes Z1 and Z2. In the illustrated embodiment each zener diode has an avalanche voltage of 5 volts for a total of 10 volts avalanche voltage. The voltage drop across these zeners plus the voltage drop across resistor R3 add to make $V_{BCK}$. This gives about 10 volts plus the threshold of Q2 (about 1.5 volts) for $V_{BCK}$.

This power supply circuit 14 regulates $V_{BCK}$ through a feedback mechanism as follows. If the voltage at $V_{BCK}$ increases for some reason above its steady state value, this causes the voltage across R3 to increase causing Q20 to turn on more heavily, which then causes the gate node voltage of Q10 to decrease. This decrease in gate voltage decreases the drain current of Q10 which then closes the feedback loop by causing a decrease in the voltage of $V_{BCK}$ which initially increased. The opposite situation results if the change in $V_{BCK}$ is opposite, i.e., if $V_{BCK}$ decreases.

The output is take from the point labeled $V_{BCK}$. As mentioned above, the output voltage is about 12 volts in the illustrated embodiment. This voltage is only needed if $V_{CC}$ fails. When $V_{CC}$ is present, it is desirable to turn off the power supply circuit 14 to save power. However, this is not necessary. The voltage $V_{BCK}$ can be continuously present, even during normal operation. In the embodiment shown, the back-up power supply is arranged to shut off during normal operation. Q20 senses the power supply output at $V_{BCK}$ and provides a shutoff function of the circuit by sensing the voltage across R3. The higher voltage at $V_{BCK}$ and hence across R3 will turn on Q20 more (VT approximately 1.5 volts) and will decrease the gate drive of the supplying transistor Q10. After the shutoff, the symmetrical device Q30 has its drain connected to ground and its gate/source to $V_{BCK}$. This causes Q30 to turn on with the source and drain interchanged. Then, R1 in the interchanged source circuit of Q30 limits the power dissipation during the shutoff operation.

The circuit also provides short circuit protection. If $V_{BCK}$ were to be shorted or overloaded, all that portion of the circuit below the $V_{BCK}$ point would be eliminated and the source of Q10 would be connected to ground through resistor R2, which may be, for example, 20 K ohms. This will cause too much power dissipation from $V_{BUS}$ without a current limit. In this case, Q30 senses a greater voltage drop across R2 in the short circuit operation and turns on, bringing down the gate voltage of Q10, limiting the maximum current.

Although the present invention has been described in relation to particular embodiments thereof, many other variations and modifications and other uses will become apparent to those skilled in the art. It is preferred, therefore, that the present invention not be limited by the specific disclosure herein.

What is claimed is:

1. A safety circuit for providing protection against failures that impact safety of an inverter circuit driving a Permanent Magnet Synchronous Motor (PMSM) including high and low side switches connected in a bridge and driven by a gate driver circuit during operation of the PMSM in a field weakening mode, the gate driver circuit including output stages for respectively driving the high and low side switches, the high and low side switches being connected to the motor terminals, the safety circuit comprising:
   a main power supply for supplying a main power supply voltage; and
   a back-up power supply for supplying a back-up power supply voltage to the gate driver circuit driving the switches of the bridge of the inverter circuit, the main and back-up power supplies receiving power from a DC Bus,
   wherein if the main power supply fails to deliver adequate electrical power to the gate driver circuit, the back-up power supply provides power to the gate driver circuit to allow the gate driver circuit to turn ON the low side switches and turn OFF the high side switches to reduce the motor speed.

2. The safety circuit of claim 1, wherein the safety circuit is utilized in an automatic clothes washer.

3. The safety circuit of claim 1, wherein turning ON the low side switches of the bridge short circuits the terminals of the motor and causes a reduction in motor speed and controls voltages generated in the motor to a safe level.

4. The safety circuit of claim 1, wherein the output stages provide a gate drive signal to the low side switch, the output stage receiving power from the back-up power supply when power from the main power supply fails and biasing the output stage, whereby when the main power supply voltage fails, the output stage produces a gate drive signal to turn the low side switches ON to short circuit the motor.

5. The safety circuit of claim 4, further comprising a pre-driver stage in the gate driver circuit driving a latch stage having an output provided to an input of a driver driving a high side switch, and wherein the back-up power supply voltage is provided to bias the pre-driver stage when the main power supply fails, whereby when a pre-driver signal to the pre-driver stage fails when the main power supply fails, the pre-driver stage provides an output to cause the high side switch to be turned OFF.

6. The safety circuit of claim 1, wherein the inverter circuit includes a rectifier providing a DC bus voltage from an AC source to the DC bus and an inverter having its input coupled to the DC bus, a DC bus storage capacitor being coupled across the DC bus, the back-up power supply receiving power from energy stored in the DC bus capacitor when the main power supply fails.

7. The safety circuit of claim 1, further comprising a selection circuit for providing the back-up power supply voltage to the gate driver circuit when the main power supply fails.

8. The safety circuit of claim 7, wherein the selection circuit comprises first, second and third selection switches, wherein
the first selection switch is connected to the main power supply voltage,
the second selection switch is connected to the back-up power supply voltage, and
the first and second selection switches are connected in series, the third selection switch having a control electrode coupled to the main power supply voltage and being connected to control whether the second switch is on or off in dependence on the presence or absence of said main power supply voltage.

9. The safety circuit of claim 8, further comprising a resistor connected in series with the third selection switch.

10. The safety circuit of claim 1, wherein when the main power supply voltage is present, the back-up power supply voltage is removed from the gate driver circuit.

11. The safety circuit of claim 1, wherein the back-up power supply includes a high voltage transistor coupled to the DC bus providing a reduced voltage as the back-up power supply voltage.

12. A gate driver IC for protecting an inverter circuit driving a Permanent Magnet Synchronous Motor during a failure of a main power supply, the circuit comprising:
a back-up power supply for supplying a back-up power supply voltage;
high- and low-side output stage circuits each including an output terminal for providing output signals to respective output pins of the IC;
a pulse generator circuit for providing pulses for driving the high- and low-side output stages; and
the low-side output stage circuit and pulse generator circuits further comprise an inverter circuit connected to the back-up power supply, wherein if the main power supply fails to deliver adequate electrical power to the gate driver circuit, the back-up power supply provides power to bias the inverter circuits to allow the low-side output stage to turn ON and the high side output stage to turn OFF to reduce the motor speed.

13. The IC of claim 12, wherein the low-side output stage circuit further comprises a pre-driver circuit powered by the main power supply and a driver circuit powered by the back-up power supply, the driver circuit being coupled between the output pin corresponding to the low-side output and the output terminal of the pre-driver.

14. The IC of claim 13, wherein the pulse generator circuit further comprises a main circuit powered by the main power supply and a back-up circuit powered by the back-up power supply, the main and the back-up circuits being coupled to the pulse generator and a respective switch, each switch providing driving pulses for the high side output stage.

* * * * *